United States Patent [19]
Leibovitz et al.

[11] Patent Number: 5,749,988
[45] Date of Patent: *May 12, 1998

[54] REWORKABLE DIE ATTACHMENT TO HEAT SPREADER

[76] Inventors: Jacques Leibovitz, 1536 Larkspur Dr., San Jose, Calif. 95125; Peter F. Dawson, 25 Tintern La., Portola Valley, Calif. 94025; Voddarahalli K. Nagesh, 20276 Pintage Pkwy., Cupertino, Calif. 95014; Greg M. Irby, 2260 Cherry Ave., San Jose, Calif. 95125

[*] Notice: The term of this patent shall not extend beyond the expiration date of Pat. No. 5,268,048.

[21] Appl. No.: 310,358

[22] Filed: Sep. 21, 1994

Related U.S. Application Data

[63] Continuation of Ser. No. 988,639, Dec. 10, 1992, abandoned.

[51] Int. Cl.⁶ .................................................. B32B 31/00
[52] U.S. Cl. .......................... 156/94; 156/307.5; 156/427; 437/209
[58] Field of Search ..................... 156/94, 307.3, 156/307.5, 310, 427; 437/205, 207, 209

[56] References Cited

U.S. PATENT DOCUMENTS

| | | | |
|---|---|---|---|
| 4,012,832 | 3/1977 | Crane | 29/575 |
| 4,139,051 | 2/1979 | Jones et al. | 29/559 |
| 4,769,270 | 9/1988 | Nagamatsu | 428/206 |
| 5,086,018 | 2/1992 | Conru | 437/207 |
| 5,093,281 | 3/1992 | Eshima | 437/207 |
| 5,137,836 | 8/1992 | Lam | 437/8 |
| 5,220,724 | 6/1993 | Gerstner | 29/840 |
| 5,268,048 | 12/1993 | Leibovitz et al. | 156/94 |
| 5,317,438 | 5/1994 | Suzuki et al. | 359/88 |

*Primary Examiner*—James Engel

[57] ABSTRACT

A silicon die, such as an integrated circuit, is reworkably bonded to a copper heat spreader. The silicon-copper bond exhibits high compliance under conditions of thermal stress even though there is a significant thermal coefficient of expansion difference between silicon and copper. A compliant adhesive is applied to the surface of one of the silicon die and the copper heat spreader and is cured. Thereafter, a thermoplastic adhesive is applied to bond the silicon die to the copper heat spreader. A composite bond is thereby produced, including a highly compliant layer and a thermoplastic layer. The die may be reworked by heating the thermoplastic adhesive until the bond begins to soften and the die is released.

16 Claims, 1 Drawing Sheet

REWORKABLE DIE ATTACHMENT TO HEAT SPREADER

This is a continuation of application Ser. No. 07/988,639 filed on Dec. 10, 1992, now abandoned.

BACKGROUND OF THE INVENTION

1. Technical Field

The present invention relates to electronic assemblies. More particularly, the present invention relates to reworkably attaching integrated circuits and related devices to a thermal transport substrate.

2. Description of the Prior Art

Heat produced by integrated circuits through power dissipation must be conducted away from the integrated circuit or the circuit will be subjected to excessive thermal stress and most likely damaged. Accepted practice for conducting heat away from an integrated circuit is to attach the integrated circuit to a heat spreader which spreads the heat to a larger surface cooled by air.

Depending on the power density and on the heat spreader, it may additionally be necessary to conduct heat from the heat spreader to a finned heat sink. A heat sink is formed in various shapes by extruding aluminum or other materials. Aluminum is an inexpensive material having excellent thermal properties, and heat sinks are accordingly relatively inexpensive.

A heat spreader is made of kovar and/or other expensive alloys. The use of a distinct heat spreader is necessary to mediate the temperature expansion coefficient (TCE) mismatch between the aluminum heat sink and the silicon integrated circuit. Such mismatch manifests itself in unequal amounts of expansion and contraction of silicon and aluminum in response to changes in temperature. This unequal movement of each material relative to the other stresses, and can ultimately break, a bond between the materials. As alloy heat spreaders are extremely expensive (and typically less efficient than other materials, such as copper or aluminum, as a medium of thermal exchange), it would be desirable to eliminate the alloy heat spreader and therefore reduce cost of manufacture by substituting a less expensive material, such as copper.

It is possible to permanently bond a silicon integrated circuit to a copper heat spreader such that a compliant bond is maintained between the integrated circuit and the heat spreader. When exposed to thermal cycling, the bond between the silicon integrated circuit and the copper heat spreader is not broken due to thermal stress (i.e. the difference in the TCE between silicon and copper). For example, Ablebond™ 84-1A, manufactured by Ablestik Laboratories of Rancho Dominguez, Calif. is a compliant silver-filled adhesive epoxy that mediates the TCE difference between silicon and copper and is therefore capable of maintaining a bond between a silicon integrated circuit and a copper heat spreader under conditions of thermal stress.

One disadvantage of an adhesive epoxy, is that the bond formed by the adhesive is not reworkable. That is, the integrated circuit may not be removed from and reattached to the copper heat spreader without damaging either the integrated circuit, neighboring components, and/or the heat spreader. Such reworkability is very desirable. For example, it is often desirable to remove and replace one defective integrated circuit on a module containing several integrated circuits, rather than discard an entire module. In this way production yields are increased and manufacturing costs are reduced.

Reworkable die attachment compounds are known. For example, compliant thermoplastic adhesives are known that are both reworkable and that also mediate the TCE mismatch between silicon and alumina. One such compound is Staystik 181™ manufactured by Staystik, Inc. of Santa Ana, Calif. However, such adhesives do not mediate the TCE mismatch between silicon and heatspreader and/or heatsink materials, such as copper or aluminum. That is, alumina, an oxide of aluminum, is a ceramic having a TCE of about $7 * 10^{-6}$ cm/cm–° C. ($7 * 10^{-6}$ inches/inch–° C.). This TCE value compares favorably with that of doped silicon, which is about $2.3*10^{-6}$ cm/cm–° C. ($2.3*10^{-6}$ inches/inch–° C.). In contrast, copper has a TCE value of $17*10^{-6}$ cm/cm–° C. ($17*10^{-6}$ inches/inch–° C.); and aluminum has a TCE value of $24*10^{-6}$ cm/cm–° C. ($24*10^{-6}$ inches/inch–° C.) !

Thus, although it is possible to replace an expensive alloy heat spreader with a copper heat spreader, it is not known how to produce a reworkable bond between an integrated circuit and the heat spreader. This inability to rework an integrated circuit/heat spreader bond becomes an important consideration when chips are closely mounted on a surface and share a common heat spreader and/or heat sink.

SUMMARY OF THE INVENTION

The present invention provides a reworkable bond between a silicon integrated circuit and a heat spreader, and a method for reworkably attaching a silicon integrated circuit to a heat spreader. The bond provided by the present invention exhibits good compliance. Additionally, bonds formed, for example between silicon and copper, in accordance with the present invention exhibit excellent ability to withstand TCE differences under conditions of thermal stress.

In the preferred embodiment of the invention, a compliant silver-filled epoxy adhesive is applied to the bond surface of either a copper heat spreader or an integrated circuit and cured. Thereafter, the integrated circuit is bonded to the copper heat spreader with a silver-filled compliant thermoplastic adhesive. A composite bond is thus produced including a highly compliant epoxy adhesive layer and a compliant reworkable thermoplastic adhesive layer.

The resulting composite is useful for forming reworkable silicon to copper bonds. Rework is accomplished by heating the integrated circuit to soften the thermoplastic adhesive bond, which allows the integrated circuit to be removed. TCE mismatch mediation is accomplished by the compliant silver-filled epoxy adhesive layer.

DETAILED DESCRIPTION OF THE INVENTION

Figure 1:
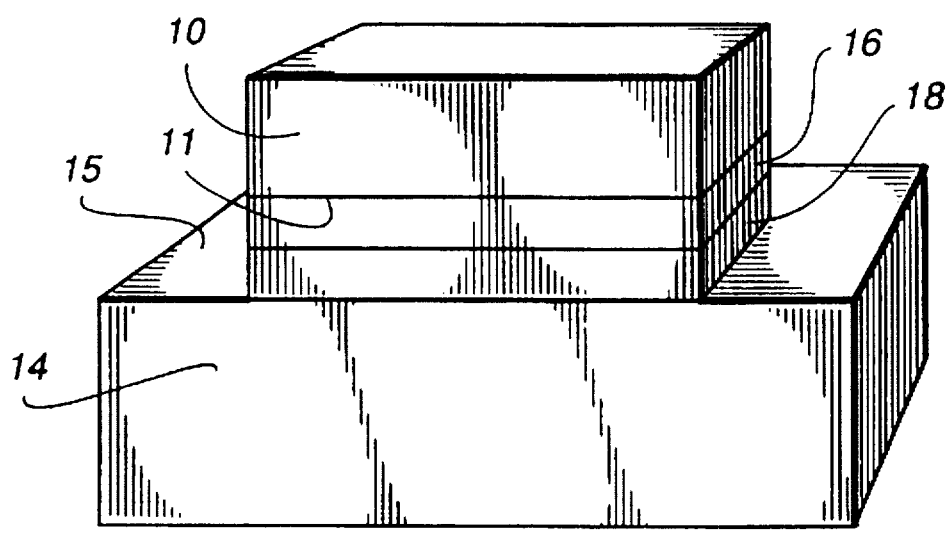
FIG. 1 is a schematic perspective view of a silicon-copper bond according to the present invention.

The present invention is best understood by referring to the Drawings in connection with review of this Description. The present invention provides a highly compliant reworkable bond, exhibiting excellent mediation of thermal coefficient of expansion mismatch.

FIG. 1 is a schematic perspective view of an integrated circuit 10 that has been bonded to a heat spreader 14 in accordance with the present invention. The present invention provides a composite bond 16/18 in which a layer of thermosetting adhesive is included to provide high compliance under conditions of thermal stress and thermal coefficient of expansion mismatch; and in which a layer of thermoplastic adhesive is included to provide a reworkable bond, such that the integrated circuit 10 may be readily removed from the heat spreader 14 by the application of heat.

The present invention as described herein is directed to bonding a components which is a silicon integrated circuit, to a copper heat spreader. It will be appreciated by those skilled in the art that the present invention is readily applicable to other component compositions, for example GaAs, etc. integrated circuits, and other heat spreader and/or heat sink compositions, for example aluminum, etc. In fact, the bond and method of the present invention are useful to bond integrated circuits directly to an aluminum heat sink, thus eliminating altogether the heat spreader. In such applications the aluminum heat sink base thickness may be increased to spread the heat to the surface of the heat sink peripheral fins.

In one embodiment of the invention, a compliant silver-filled epoxy adhesive is applied to the heat spreader surface 15 and then cured in accordance with the manufacturer's recommendations. An example of such epoxy adhesive as would be useful in practicing the present invention is Ablebond™ 84-1A, manufactured by Ablestik Laboratories of Rancho Dominguez, Calif. Other adhesives are also readily used in practicing the invention, although it is preferred that any such adhesive is a compliant silver-filled epoxy that mediates the TCE difference between silicon and copper and that is therefore capable of maintaining a bond between a silicon integrated circuit and a copper heat spreader under conditions of thermal stress. Although a silver-filled adhesive is described in connection with the preferred embodiment of the invention because such composition promotes heat transfer from an integrated circuit to a heat spreader, other compositions may be used without departing from the scope and spirit of the invention.

After the adhesive applied to the surface of the heat spreader has been cured, the integrated circuit is bonded to the epoxy covered copper heat spreader using a silver-filled compliant thermoplastic adhesive. The bond thus produced is then cured (e.g. in the preferred embodiment of the invention curing occurs for 30 minutes at 220° C.). An example of a thermoplastic adhesive that may be used in practicing the present invention is Staystik 181™ manufactured by Staystik, Inc. of Santa Ana, Calif.

The bond thus formed between the integrated circuit and the heat spreader may be readily reworked, e.g. to replace a defective integrated circuit, or to salvage a valuable integrated circuit for use elsewhere. Rework is accomplished by heating the integrated circuit locally and detaching it from the heat spreader at the thermoplastic adhesive layer. Thereafter, a replacement integrated circuit may be attached to the heat spreader by the same technique. As the thermosetting layer remains on the surface of the heat spreader, it is only necessary to bond the replacement integrated circuit to the heat spreader with a thermoplastic adhesive. Alternatively, the residue of thermoplastic adhesive present on the surface of the heat spreader after an integrated circuit is removed therefrom may be reused.

It should be recognized that the present invention is intended to be practiced in various embodiments. Therefore, the thermoplastic adhesive may be applied before the thermosetting adhesive is applied. In such embodiment, the surface 11 of the integrated circuit is coated with a thermoplastic adhesive. After such adhesive cures, the integrated circuit and the heat spreader are bonded together with a thermosetting adhesive.

Another alternate embodiment of the invention applies the thermosetting adhesive to the integrated circuit and the thermoplastic adhesive to the heat spreader. Thus, two structural bond configurations are provided: Cu/thermosetting adhesive/thermoplastic adhesive/Si; and Cu/thermoplastic adhesive/thermosetting adhesive/Si.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. A method for forming a releasable, compliant bond between a component having a component bond surface and a heat spreader having a heat spreader bond surface, wherein the component and the heat spreader possess different coefficients of thermal expansion, the method comprising the steps of:

coating the bond surface of at least one of said component and said heat spreader with a thermoplastic adhesive;

allowing said thermoplastic adhesive to harden;

adhering said component to said heat spreader by coating at least one of said component bond surface and said heat spreader bond surface with a compliant thermosetting adhesive and, thereafter, bringing said component bond surface and said heat spreader bond surface together;

curing said thermosetting adhesive;

wherein the compliant thermosetting adhesive makes the bond compliant, the compliance of the compliant bond maintains the component and the heat spreader bonded to each other throughout their different expansions and contractions accompanying temperature excursions during operation; and wherein the thermoplastic adhesive makes the bond reworkable.

2. A method for forming a releasable, compliant bond between a component having a component bond surface and a heat spreader having a heat spreader bond surface, wherein the component and the heat spreader possess different coefficients of thermal expansion, the method comprising the steps of:

coating at least one of said component bond surface and said heat spreader bond surface with a compliant thermosetting adhesive;

curing said thermosetting adhesive;

adhering said component to said heat spreader by coating the bond surface of at least one of said component and said heat spreader with a thermoplastic adhesive and, thereafter, bringing said component bond surface and said heat spreader bond surface together; and allowing said thermoplastic adhesive to harden;

wherein the compliant thermosetting adhesive makes the bond compliant, the compliance of the compliant bond maintains the component and the heat spreader bonded to each other throughout their different expansions and contractions accompanying temperature excursions during operation; and wherein the thermoplastic adhesive makes the bond reworkable.

3. The method of either of claims 1 or 2, further comprising the step of:

releasing said component from said heat spreader by applying sufficient heat to the bond between said heat spreader and said component to soften said thermoplastic adhesive.

4. The method of either of claims 1 or 2, wherein said component is a silicon integrated circuit.

5. The method of either of claims 1 or 2, wherein said heat spreader is made from one of copper or aluminum.

6. The method of either of claims 1 or 2, wherein said thermoplastic adhesive is applied to said component bond surface.

7. The method of either of claims 1 or 2, wherein said thermoplastic adhesive is applied to said heat spreader bond surface.

8. The method of either of claims 1 or 2, wherein said thermosetting adhesive is applied to said component bond surface.

9. The method of either of claims 1 or 2, wherein said thermoplastic adhesive is applied to said heat spreader bond surface.

10. The method of either of claims 1 or 2, wherein said heat spreader is a heat sink.

11. A releasable, compliant bond formed between a component having a component bond surface and a heat spreader having a heat spreader bond surface, wherein the component and the heat spreader possess different coefficients of thermal expansion, the bond comprising:

a thermoplastic adhesive coating on the bond surface of at least one of said component and said heat spreader;

a compliant thermosetting adhesive coating on at least one of said component bond surface and said heat spreader bond surface, wherein the compliant thermosetting adhesive coating abuts the thermoplastic adhesive coating;

wherein the compliant thermosetting adhesive makes the bond compliant, the compliance of the compliant bond maintains the component and the heat spreader bonded to each other throughout their different expansions and contractions accompanying temperature excursions during operation; and wherein the thermoplastic adhesive makes the bond reworkable.

12. The bond of claim 11, wherein said component is released from said heat spreader by applying sufficient heat to said bond to soften said thermoplastic adhesive.

13. The bond of claim 11, wherein said thermosetting adhesive is an epoxy.

14. The bond of claim 11, wherein said component is a silicon integrated circuit.

15. The bond of claim 11, wherein said heat spreader is made of one of copper or aluminum.

16. The bond of claim 11, wherein said heat spreader is a heat sink.

* * * * *